(12) United States Patent
Zhou

(10) Patent No.: US 12,131,990 B2
(45) Date of Patent: Oct. 29, 2024

(54) SEMICONDUCTOR STRUCTURE WITH A CONTACT TO SOURCE/DRAIN LAYERS AND FABRICATION METHOD THEREOF

(71) Applicants: Semiconductor Manufacturing International (Shanghai) Corporation, Shanghai (CN); Semiconductor Manufacturing International (Beijing) Corporation, Beijing (CN)

(72) Inventor: Fei Zhou, Shanghai (CN)

(73) Assignees: Semiconductor Manufacturing International (Shanghai) Corporation, Shanghai (CN); Semiconductor Manufacturing International (Beijing) Corporation, Beijing (CN)

( * ) Notice: Subject to any disclaimer, the term of this patent is extended or adjusted under 35 U.S.C. 154(b) by 229 days.

(21) Appl. No.: 17/326,846

(22) Filed: May 21, 2021

(65) Prior Publication Data
US 2021/0398901 A1    Dec. 23, 2021

(30) Foreign Application Priority Data
Jun. 23, 2020    (CN) .......................... 202010581157.3

(51) Int. Cl.
*H01L 23/522*      (2006.01)
*H01L 21/285*      (2006.01)
(Continued)

(52) U.S. Cl.
CPC .... *H01L 23/5226* (2013.01); *H01L 21/76877* (2013.01); *H01L 21/76883* (2013.01);
(Continued)

(58) Field of Classification Search
CPC ..... H01L 21/823431; H01L 21/823821; H01L 21/845; H01L 27/0886; H01L 27/0924;
(Continued)

(56) References Cited

U.S. PATENT DOCUMENTS

| 10,243,053 B1* | 3/2019 | Xie ................ H01L 21/823437 |
| 2016/0126326 A1* | 5/2016 | Park ...................... H01L 23/485 |
| | | 257/368 |

(Continued)

FOREIGN PATENT DOCUMENTS

CN          111200017 A      5/2020

*Primary Examiner* — Younes Boulghassoul
(74) *Attorney, Agent, or Firm* — Anova Law Group, PLLC

(57) ABSTRACT

Semiconductor structures and fabrication methods are provided. The semiconductor includes a substrate; a plurality of discrete fins on the substrate; a gate structure on the substrate, and across the plurality of discrete fins by covering portions of sidewall surfaces and top surfaces of the plurality of discrete fins; a plurality of doped source/drain layers in the plurality of discrete fins and at both sides of the gate structure; a conductive layer, formed at one or two sides of the gate structure, connecting multiple doped source/drain layers of the plurality of doped source/drain layers, and with a top surface lower than a top surface of the gate structure; and a conductive plug on the conductive layer and in contact with a portion of a surface of the conductive layer.

19 Claims, 11 Drawing Sheets

(51) Int. Cl.
*H01L 21/768* (2006.01)
*H01L 23/532* (2006.01)
*H01L 29/417* (2006.01)
*H01L 29/45* (2006.01)
*H01L 29/66* (2006.01)
*H01L 29/78* (2006.01)

(52) U.S. Cl.
CPC .. *H01L 21/76897* (2013.01); *H01L 29/41775* (2013.01); *H01L 29/41783* (2013.01); *H01L 29/41791* (2013.01); *H01L 29/66795* (2013.01); *H01L 29/785* (2013.01); *H01L 21/28518* (2013.01); *H01L 23/53209* (2013.01); *H01L 23/53214* (2013.01); *H01L 23/53228* (2013.01); *H01L 23/53242* (2013.01); *H01L 23/53257* (2013.01); *H01L 29/456* (2013.01)

(58) Field of Classification Search
CPC .......... H01L 27/1211; H01L 27/10826; H01L 27/10879; H01L 29/66795–66818; H01L 29/785–7856; H01L 2029/7857–7858; H01L 2924/13067; H01L 29/41725–41791; H01L 29/456; H01L 29/458; H01L 21/823475; H01L 21/823871; H01L 21/76877; H01L 21/76883; H01L 21/76897; H01L 23/5283; H01L 23/5226; H01L 23/485; H01L 29/41775; H01L 29/41783; H01L 29/78696; H01L 29/42392; H01L 29/0673; H01L 29/66439; H01L 29/775; H01L 29/665–66507; H01L 29/7845; H01L 21/28518; H01L 21/32053; H01L 21/76889; H01L 23/53209; H10B 12/36; H10B 12/056

See application file for complete search history.

(56) References Cited

U.S. PATENT DOCUMENTS

| | | | |
|---|---|---|---|
| 2016/0322304 A1* | 11/2016 | Kim | H01L 29/66795 |
| 2017/0345825 A1 | 11/2017 | Park et al. | |
| 2019/0157158 A1* | 5/2019 | Leobandung | H01L 21/823431 |
| 2019/0393318 A1* | 12/2019 | Chung | H01L 29/66795 |
| 2020/0075595 A1* | 3/2020 | Shin | H01L 29/41775 |
| 2020/0402861 A1* | 12/2020 | Zang | H01L 21/76805 |
| 2021/0050253 A1* | 2/2021 | Chiou | H01L 21/76895 |
| 2021/0066453 A1* | 3/2021 | Lee | H01L 29/775 |
| 2021/0082757 A1* | 3/2021 | Lee | H01L 21/28114 |
| 2021/0134973 A1* | 5/2021 | Huang | H01L 21/76897 |
| 2021/0233847 A1* | 7/2021 | Kim | H01L 23/535 |
| 2021/0384192 A1* | 12/2021 | Bae | H01L 27/0924 |
| 2021/0391433 A1* | 12/2021 | Kim | H01L 29/41791 |
| 2021/0391464 A1* | 12/2021 | Bae | H01L 27/0924 |

* cited by examiner

SEMICONDUCTOR STRUCTURE WITH A CONTACT TO SOURCE/DRAIN LAYERS AND FABRICATION METHOD THEREOF

CROSS-REFERENCE TO RELATED APPLICATION

This application claims the priority of Chinese Patent Application No. 202010581157.3, filed on Jun. 23, 2020, the content of which is incorporated by reference in its entirety.

TECHNICAL FIELD

The present disclosure generally relates to the field of semiconductor manufacturing technology and, more particularly, relates to semiconductor structures and fabrication methods.

BACKGROUND

With the development of integrated circuits (ICs) toward the very-large-scale integrated circuits (VLSIs), the density of circuits of the integrated circuits is increased, the number of included components is also increased, and the size of the components is reduced. As the size of the semiconductor structure decreases, the channel length of the device in the semiconductor structure decreases accordingly. Due to the shortening of the channel, the gradual channel approximation is no longer valid, and various unfavorable physical effects (especially the short-channel effect) are highlighted, which degrades the performance and reliability of the device and limits the further reduction of the size of the device.

To reduce the series of problems caused by the short-channel effect (for example, the decrease of the threshold voltage as the channel length decreases, the decrease of the leakage-induced barriers, the carrier surface scattering, the velocity saturation, the ionization and hot electron effects, etc.), the further reduction of the device size requires a further increase of the gate capacitance. The increase of the gate capacitance may be achieved by reducing the thickness of the gate dielectric layer. However, the decrease in the thickness of the gate dielectric layer will cause an increase in the gate leakage current. To suppress gate leakage current, a metal gate structure is introduced into the semiconductor structure. The metal gate structure includes a metal electrode and a dielectric layer having a high dielectric constant (i.e., K value). The metal gate structure can effectively increase the gate capacitance and, at the same time, effectively suppress the gate leakage current.

Meanwhile, with the increase in the circuit density, the surface of the wafer may be unable to provide enough area to form connection lines. To meet the interconnection requirements after shrinking of the components, the design of multiple-layer interconnection lines including two or more layers has become one of the methods that is often used in VLSI technology. Connection plugs are used to connect different metal layers or to connect metal layers and the semiconductor devices.

However, the parasitic capacitance between the gate and the metal layer of the semiconductor device is too large, and the performance of the semiconductor structure is adversely affected. Therefore, there is a need to reduce the parasitic capacitance in the semiconductor devices. The disclosed methods and semiconductor structures are directed to solve one or more problems set forth above and other problems in the art.

SUMMARY

One aspect of the present disclosure provides a semiconductor structure. The semiconductor structure may include a substrate; a plurality of discrete fins on the substrate; a gate structure on the substrate, and across the plurality of discrete fins by covering portions of sidewall surfaces and top surfaces of the plurality of discrete fins; a plurality of doped source/drain layers in the plurality of discrete fins and at both sides of the gate structure; a conductive layer, at one or two sides of the gate structure, connecting multiple doped source/drain layers of the plurality of doped source/drain layers, and with a top surface lower than a top surface of the gate structure; and a conductive plug on the conductive layer and in contact with a portion of a surface of the conductive layer.

Optionally, the semiconductor structure further includes an isolation structure on the substrate, covering portions of the sidewall surfaces of the plurality of fins and with a top surface lower than the top surfaces of the plurality of fins.

Optionally, the semiconductor structure further includes: a first dielectric layer on the substate; a second dielectric layer on the first dielectric layer; and a third dielectric layer in the first dielectric layer and the second dielectric layer. The first dielectric layer and the third dielectric layer cover the plurality of doped source/drain layers, the gate structure and the conductive layer; and the third dielectric layer covers the conductive plug and exposes a top surface of the conductive plug.

Optionally, the semiconductor structure further includes a contact layer on a doped source/drain layer of the plurality of doped source/drain layers; and the conductive layer is on the contact layer.

Optionally, a material of the contact layer includes nickel silicide, titanium silicide, or cobalt silicide.

Optionally, a distance between a top surface of the conductive layer and a bottom surface of the conductive layer is in a range of approximately 20 nm-500 nm.

Another aspect of the present disclosure provides a method for forming a semiconductor structure. The method may include providing a substrate; forming a plurality of fins on the substrate; forming a gate structure, on the substrate and across the plurality of fins by covering portions of sidewall surfaces and top surfaces of the plurality of fins; forming a plurality of doped source/drain layers in the plurality of fins and at both sides of the gate structure; forming a conductive layer at one or two sides of the gate structure, wherein the conductive layer is connected to multiple doped source/drain layers of the plurality of doped source/drain layers and a top surface of the conductive layer is lower than a top surface of the gate structure; and forming a conductive plug, on the conductive layer and in contact with a portion of the top surface of the conductive layer.

Optionally, before forming the gate structure, the method further includes forming an isolation structure on the substrate. The isolation structure covers portions of the sidewall surfaces of the plurality of fins and a top surface of the isolation structure is lower than the top surfaces of the plurality of fins.

Optionally, the method further includes forming a first dielectric layer, on the substrate and covering sidewall surfaces of the plurality of doped source/drain layers and sidewall surfaces of the gate structure.

Optionally, after forming the first dielectric layer, the method further includes forming a second dielectric layer on the first dielectric layer and the gate structure.

Optionally the method for forming the conducive layer includes forming a first dielectric layer opening in the first dielectric layer and the second dielectric layer to expose the plurality of doped source/drain layers and the gate structure; forming an initial conductive layer on the plurality of doped source/drain layers and the gate structure to fill the first dielectric layer opening; and etching the initial conductive layer to form the conductive layer with a top surface lower than the top surface of the gate structure.

Optionally, after forming the conductive layer, the method further includes forming a third dielectric layer on the conductive layer to fill the first dielectric layer opening.

Optionally, a distance between the top surface of the conductive layer and a bottom surface of the conductive layer is in a range of approximately 20 nm-500 nm.

Optionally, the method for forming the conductive plug includes forming a second dielectric layer opening in the third dielectric layer to expose the portion of the top surface of the conductive layer; and forming the conductive plug in the second dielectric layer opening, wherein a bottom surface of the conductive plug is in contact with the portion of the top surface of the conductive layer.

Optionally, before forming the conductive layer, the method further includes forming a contact layer on a doped source/drain layer of the plurality of doped source/drain layers.

Optionally, the method for forming the contact layer includes forming an initial contact layer on the doped source/drain layer; and performing an annealing process on the doped source/drain layer to form the contact layer.

Optionally, a material of the contact layer includes nickel silicide, titanium silicide, or cobalt silicide.

Optionally, a duration of the annealing process is in a range of approximately 5 s-30 s; and a temperature of the annealing process is in range of approximately 600° C.-1000° C.

Optionally, a material of the conductive plug includes tungsten, aluminum, copper, titanium, silver, lead, or nickel.

Optionally, a material of the conductive layer includes tungsten, aluminum, copper, titanium, silver, lead, or nickel.

The present disclosure may have the following beneficial effects.

In the structures of the technical solutions of the present disclosure, the top surface of the conductive layer may be lower than the top surface of the gate structure, and the conductive plug may be located on a portion of the surface of the conductive layer. As a result, the projection of the finally formed conductive layer and conductive plug on the gate structure may be substantially small. Thus, the parasitic capacitance between the conductive layer and the conductive plug and the gate structure may be reduced, and the performance of the resulting semiconductor structure may be improved.

Further, the distance between the top surface of the conductive layer and the bottom surface of the conductive layer may be in a range of approximately 20 nm to 500 nm. The height of the conductive layer within such a range may not only realize that the conductive layer may connect a plurality of the doped source/drain layers, but also may effectively reduce the direct facing area between the conductive layer and the gate structure. Thus, the parasitic capacitance between the conductive and the gate structure may be reduced, and the performance of the final semiconductor structure may be improved.

In the formation method of the technical solution of the present disclosure, the top surface of the conductive layer may be formed to be lower than the top surface of the gate structure, and the conductive plug may be formed on a portion of the surface of the conductive layer. As a result, the projection of the finally formed conductive layer and conductive plug on the gate structure may be substantially small, thus the parasitic capacitance between the conductive layer and the conductive plug and the gate structure may be reduced, and the performance of the resulting semiconductor structure may be enhanced.

Further, the distance between the top surface of the conductive layer and the bottom surface of the conductive layer may be in a range of approximately 20 nm to 500 nm. The height of the conductive layer within such a range may not only realize that the conductive layer may connect a plurality of the doped source/drain layers, but also may effectively reduce the direct facing area between the conductive layer and the gate structure. Thus, the parasitic capacitance between the conducive layer and the gate structure may be reduced, and the performance of the final semiconductor structure may be improved.

BRIEF DESCRIPTION OF THE DRAWINGS

The following drawings are merely examples for illustrative purposes according to various disclosed embodiments and are not intended to limit the scope of the present disclosure.

DETAILED DESCRIPTION

Reference will now be made in detail to exemplary embodiments of the disclosure, which are illustrated in the accompanying drawings. Wherever possible, the same reference numbers will be used throughout the drawings to refer to the same or like parts.

Figure 1:
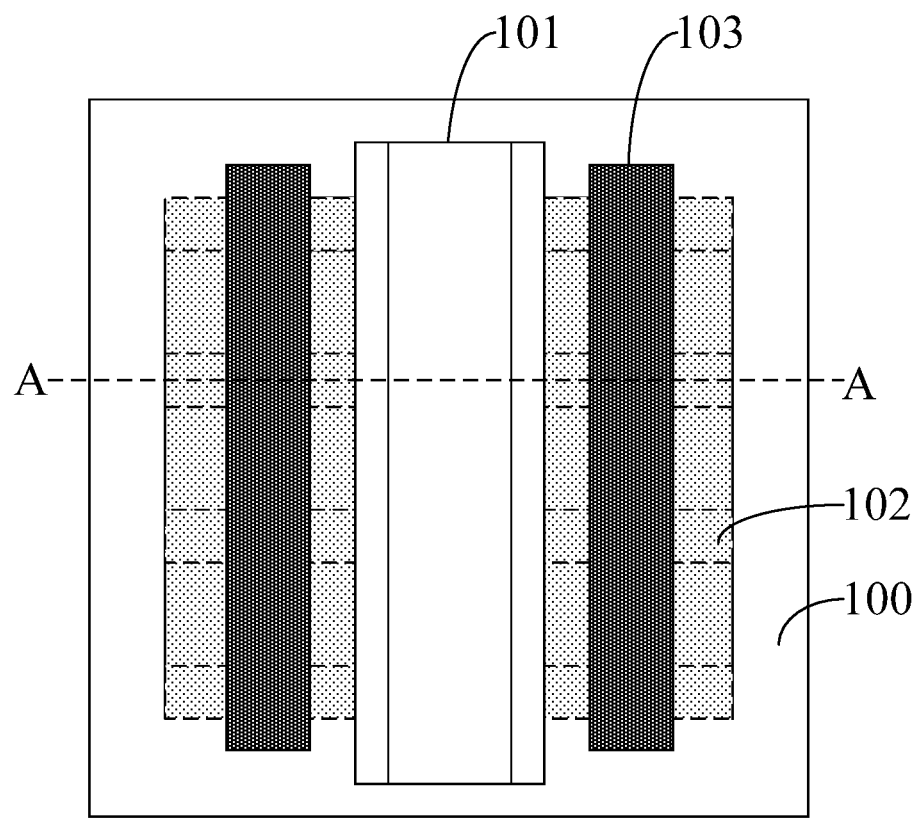
FIG. 1 illustrates a top view of a semiconductor structure.
Figure 2:
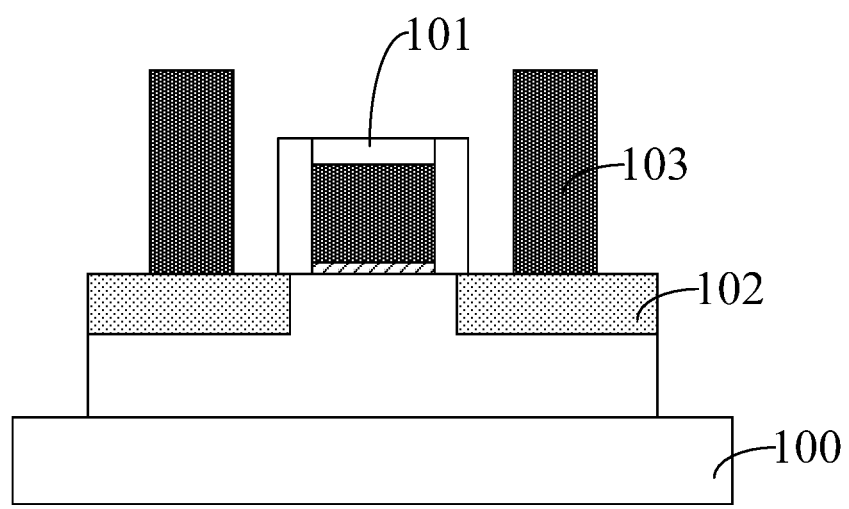
FIG. 2 illustrates a cross-sectional view of a semiconductor structure.

FIGS. 1-2 illustrate top and cross-sectional views of a semiconductor structure. FIG. 1 is a top view of the semiconductor structure; and FIG. 2 is an A-A-sectional view of FIG. 1.

As shown in FIGS. 1-2, the semiconductor structure includes a substrate 100, a gate structure 101, and a plurality of doped source/drain layers 102. The gate structure 101 is located on the substrate 100; and the plurality of doped source/drain layers 102 are located in the substrate 100 at both sides of the gate structure 101. The semiconductor structure also includes conductive layers 103 formed on the plurality of doped source/drain layers 103. The top surface of the conductive layer 103 is higher than the top surface of the gate structure 101.

In such a semiconductor structure, the plurality of the doped source/drain layers 102 are connected through the conductive layer 103 to achieve the electrical conduction requirement. However, because the top surface of the formed conductive layer 103 is higher than the top surface of the gate structure 101, the projection area of the conductive layer 103 on the gate structure 101 is relatively large. Thus, the parasitic capacitance between the conductive layer 103 and the gate structure 101 is relatively large, which in turn affects the performance of the final semiconductor structure.

The present disclosure provides a semiconductor structure and a method for forming a semiconductor structure. By forming the top surface of the conductive layer to be lower than the top surface of the gate structure, the conductive plug may be formed on a portion of the top surface of the conductive layer. Accordingly, the projection of the finally formed conductive layer and the conductive plug on the gate structure may be relatively small. Thus, the parasitic capacitance between the conductive layer and the conductive plug and the gate structure may be reduced, and the performance of the final semiconductor structure may be improved.

To make the above objectives, features and advantages of the present disclosure more obvious and understandable, specific embodiments of the present disclosure will be described in detail below with reference to the accompanying drawings.

Figure 21:
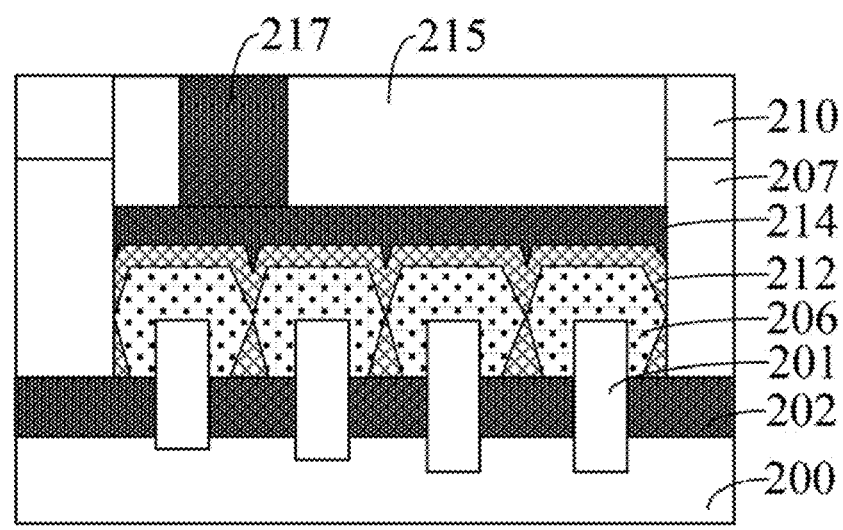
Figure 22:
FIG. 22 illustrates an exemplary fabrication process of a semiconductor structure consistent with various disclosed embodiments of the present disclosure.

FIG. 22 illustrates an exemplary fabrication method of a semiconductor structure consistent with various disclosed embodiments of the present disclosure. FIGS. 3-21 are schematic structures corresponding to certain stages during the exemplary fabrication method consistent with various disclosed embodiments of the present disclosure.

Figure 3:
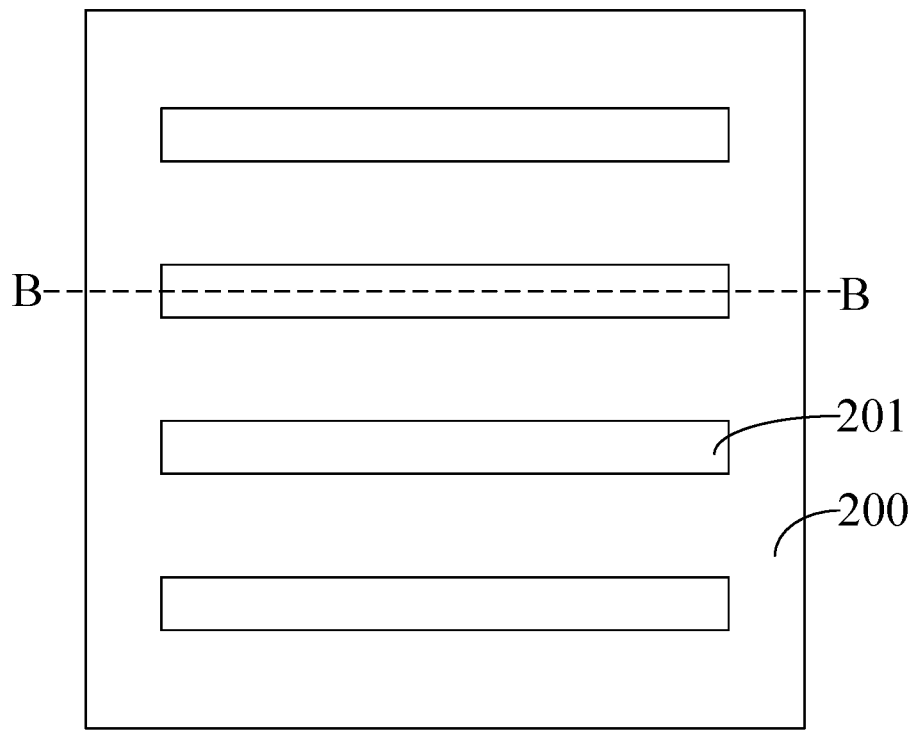
FIGS. 3-21 illustrate structures corresponding to certain stages during an exemplary fabrication process of a semiconductor structure consistent with various disclosed embodiments of the present disclosure.
Figure 4:
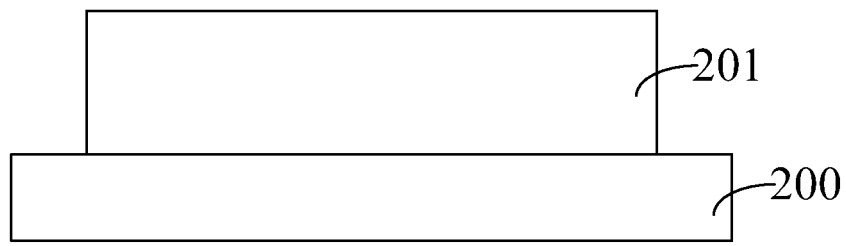

As shown in FIG. 22, at the beginning of the fabrication process, a substrate with certain structures is provided (S101). FIGS. 3-4 illustrate a corresponding structure. FIG. 3 is a top view of the semiconductor structure after forming a plurality discrete fins, and FIG. 4 is a B-B-sectional view of FIG. 3.

As shown in FIGS. 3-4, a substrate 200 is provided. A plurality discrete fins 201 may be formed on the substrate 200.

In one embodiment, the method for forming the substrate 200 and the plurality of fins 201 may include providing an initial substrate (not shown). The initial substrate may include a mask layer (not shown), and the mask layer may expose portions of the top surface of the initial substrate. Then, the initial substrate may be etched using the mask layer as an etching mask to form the substrate 200 and the plurality of fins 201 on the substrate 200.

In one embodiment, the material of the substrate 200 is silicon. In some embodiments, the material of the substrate may also be germanium, silicon germanium, silicon carbide, silicon-on-insulator, germanium-on-insulator, gallium arsenide, or indium gallium, etc.

In one embodiment, the material of the fins 201 is silicon. In some embodiments, the material of the fins may also be germanium, silicon germanium, silicon carbide, gallium arsenide, or indium gallium, etc.

Figure 5:
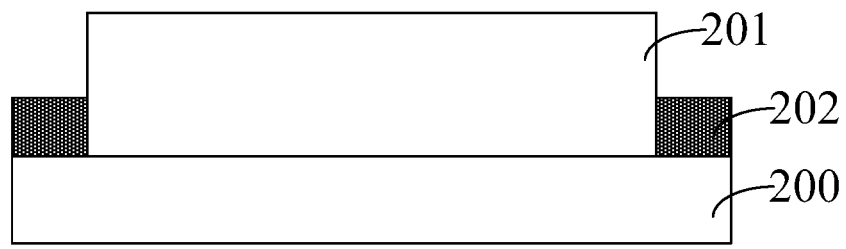

Returning to FIG. 22, after providing the substate, an isolation structure may be formed on the substrate (S102). FIG. 5 illustrates a corresponding structure. The viewing direction of FIG. 5 is same as that of FIG. 4.

As shown in FIG. 5, an isolation structure 202 may be formed on the substrate 200. The isolation structure 202 may cover portions of the sidewall surfaces of the fins 201, and the top surface of the isolation structure 202 may be lower than the top surfaces of the fins 201.

In one embodiment, the method for forming the isolation structure 202 may include forming an initial isolation structure (not shown) on the substrate 200; and etching and removing portions of the initial isolation structure to form the isolation structure 202. The top surface of the isolation structure 202 may be lower than the top surfaces of the fins 201.

The material of the isolation structure 202 may be an insulating material. The insulating material may include one or more of silicon oxide, silicon nitride, silicon carbide, silicon oxycarbide, silicon oxynitride, silicon carbonitride, aluminum oxide, aluminum nitride, hafnium oxide, and tantalum oxide, etc. In one embodiment, the material of the isolation structure 202 is silicon oxide.

After forming the isolation structure 202, the method may further include forming a gate structure and a plurality of doped source/drain layers. The gate structure may be formed on the substrate 200, and the gate structure may be across the plurality of fins 201 by covering portions of the sidewall surfaces and top surfaces of the plurality of fins 201. The doped source/drain layers may be formed in the fins 201 at both sides of the gate structure, and the doped source/drain layers in the adjacent fins 201 may be adjacent. Further, a first dielectric layer may be formed. The first dielectric layer may be formed on the substrate 200; and may cover the sidewall surfaces of the doped source/drain layers and the gate structure. The specific formation process may be referred to FIGS. 6-9.

Figure 6:
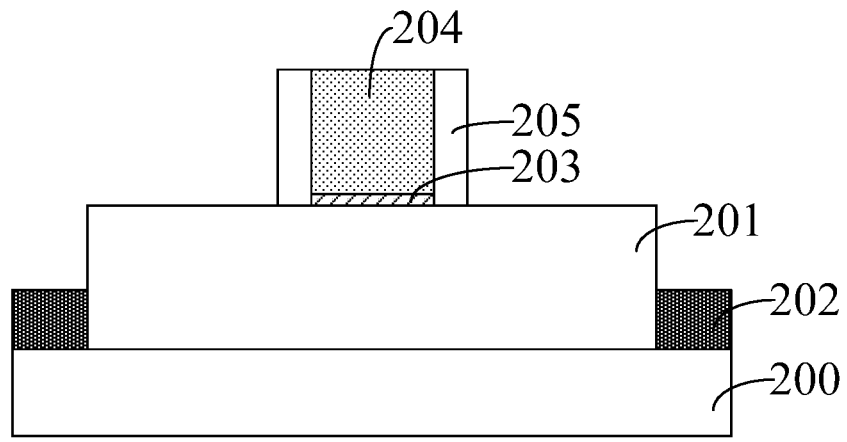

As shown in FIG. 22, after forming the isolation structure, a dummy gate structure may be formed (S103). FIG. 6 illustrates a corresponding structure.

As shown in FIG. 6, a dummy gate structure may be formed on the substrate 200. The dummy gate structure may be across the fins 201 by covering portions of sidewall surfaces and top surfaces of the fins 201.

In one embodiment, the dummy gate structure may be formed on the isolation structure 202, and the method for forming the dummy gate structure may include forming a gate dielectric layer 203 on the isolation structure 202; forming a dummy gate electrode layer 204 on the dielectric layer 203; and forming sidewall spacers 205 on the sidewall surfaces of the dummy gate layer 204.

In one embodiment, the material of the gate dielectric layer 203 is silicon oxide. In some embodiments, the material of the gate dielectric layer may also be one or more of a high dielectric constant material (the dielectric material with a dielectric constant K greater than or equal to 3.9), such as silicon oxynitride, aluminum oxide, hafnium oxide, tantalum oxide, or zirconium oxide, etc.

In one embodiment, the material of the dummy gate layer 204 is polysilicon.

Figure 7:
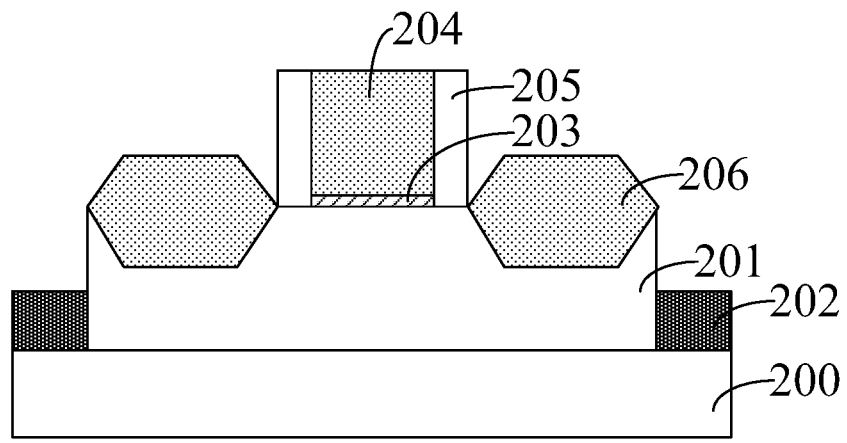

Returning to FIG. 22, after forming the dummy gate structure, a plurality of doped source/drain layers may be formed in the plurality of fins (S104). FIG. 7 illustrates a corresponding structure.

As shown in FIG. 7, after forming the dummy gate structure, the plurality of fins 201 may be etched using the dummy gate structure as an etching mask, and a plurality of doped source/drain openings (not labeled) may be formed in the fins 201; and doped source/drain layers 206 may be formed in the doped source/drain openings. For example, one doped source/drain layer 206 may be formed in one doped source/drain opening.

In one embodiment, the method for forming the doped source/drain layers 206 may include forming an epitaxial layer (not shown) in the doped source/drain openings by an epitaxial growth process. During the epitaxial growth process, the epitaxial layer may be doped in situ with doped source/drain ions to form the doped source/drain layers 206.

Figure 8:
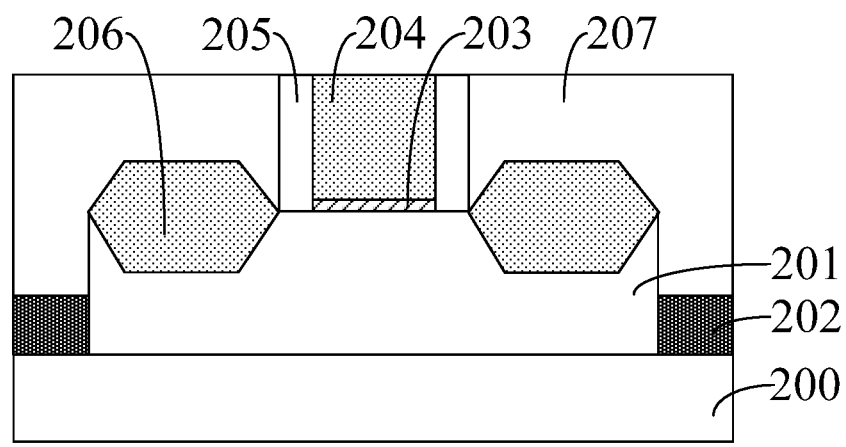

Returning to FIG. 22, after forming the doped source/drain layers, a first dielectric layer may be formed (S105). FIG. 8 illustrates a corresponding structure.

As shown in FIG. 8, after forming the doped source/drain layers 206, an initial first dielectric layer (not shown) may be formed on the substrate 200. The initial first dielectric layer may cover the doped source/drain layers 206 and the dummy gate structure. Then, the initial first dielectric layer may be planarized until the top surface of the dummy gate structure is exposed to form the first dielectric layer 207.

In one embodiment, the first dielectric layer 207 may be specifically formed on the isolation structure 202. The material of the first dielectric layer 207 may be silicon oxide. In some embodiments, the material of the first dielectric layer may also be a low-K dielectric material (i.e., a dielectric material with a relative dielectric constant K lower than 3.9) or an ultra-low-K dielectric material (i.e., a dielectric material with a relative dielectric constant K lower than 2.5).

In one embodiment, the planarization process may include a chemical mechanical polishing process (CMP). In some embodiments, the planarization process may also include a wet etching process, or a dry etching process, etc.

Figure 9:
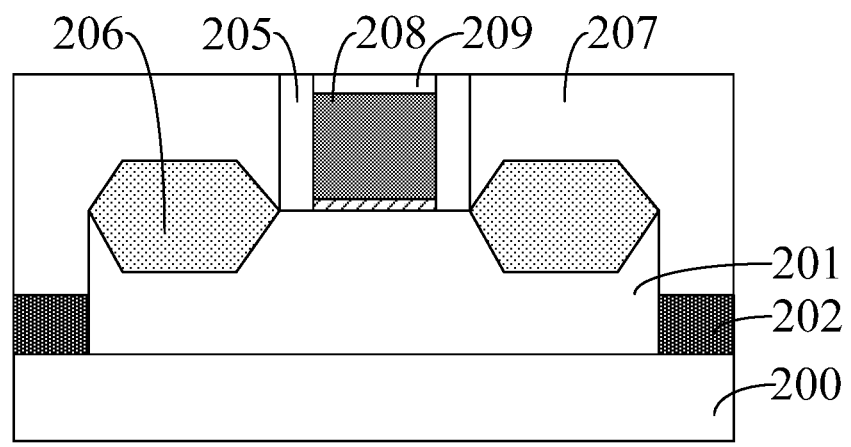

Returning to FIG. 22, after forming the first dielectric layer, the dummy gate structure may be removed to form a gate opening, and a gate structure may be formed in the gate opening (S106). FIG. 9 illustrates a corresponding structure.

As shown in FIG. 9, the dummy gate structure may be removed to form a gate opening (not labeled) in the first dielectric layer 207; and a gate structure may be formed in the gate opening.

In one embodiment, the dummy gate layer 204 of the dummy gate structure may be specifically removed. The gate structure may include a gate electrode layer 208 and a protective layer 209 on the gate electrode layer 208.

In one embodiment, the material of the gate electrode layer 208 is a metal material, and the metal material may be tungsten. In some embodiments, the metal material may also be aluminum, copper, titanium, silver, gold, lead, or nickel, etc.

In one embodiment, the material of the protective layer 209 is silicon nitride.

After forming the gate structure, the method may further include forming a conductive layer on one or both sides of the gate structure. The conductive layer may be connected to multiple doped source/drain layers 206, and the top surface of the conductive layer may be lower than the top surface of the gate structure. The specific forming process of the conductive layer may be referred to FIGS. 10-15.

Figure 10:
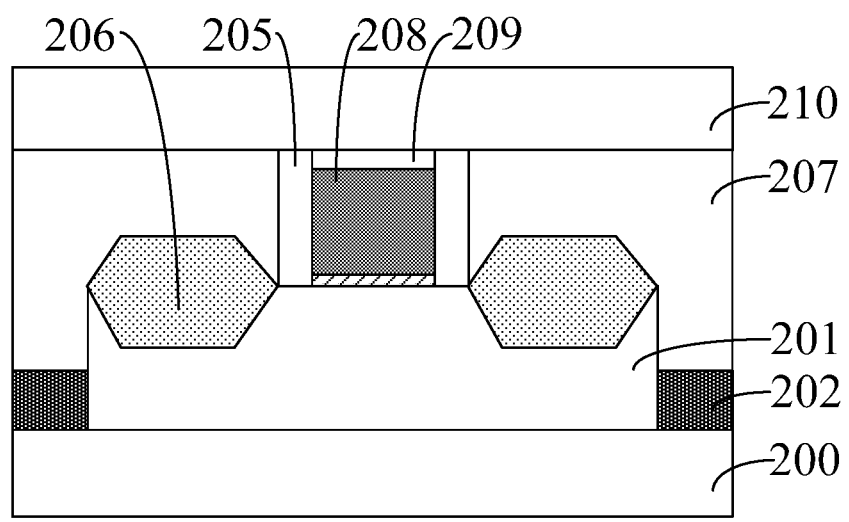

Returning to FIG. 22, after forming the gate structure, a second dielectric layer may be formed (S107). FIG. 10 illustrates a corresponding structure.

As shown in FIG. 10, a second dielectric layer 210 may be formed on the first dielectric layer 207 and on the gate structure.

In one embodiment, the material of the second dielectric layer 210 is silicon oxide. In some embodiments, the material of the second dielectric layer may also be a low-K dielectric material (i.e., a dielectric material with the relative dielectric constant K lower than 3.9) or an ultra-low K dielectric material (i.e., a dielectric material with a relative dielectric constant K lower than 2.5).

Figure 11:
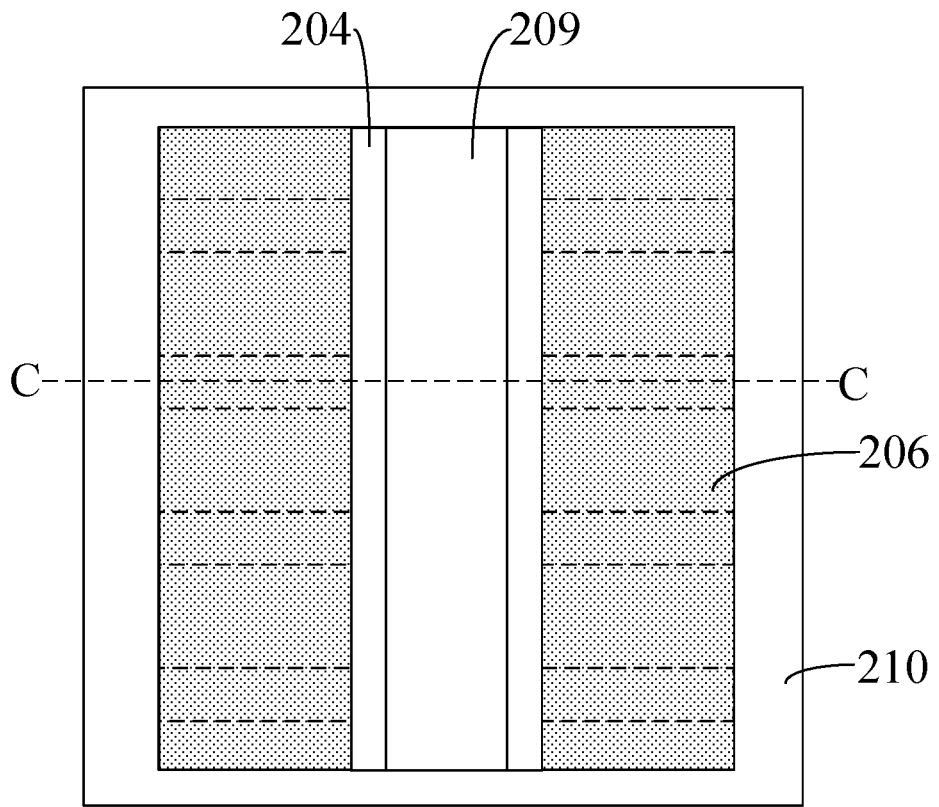
Figure 12:
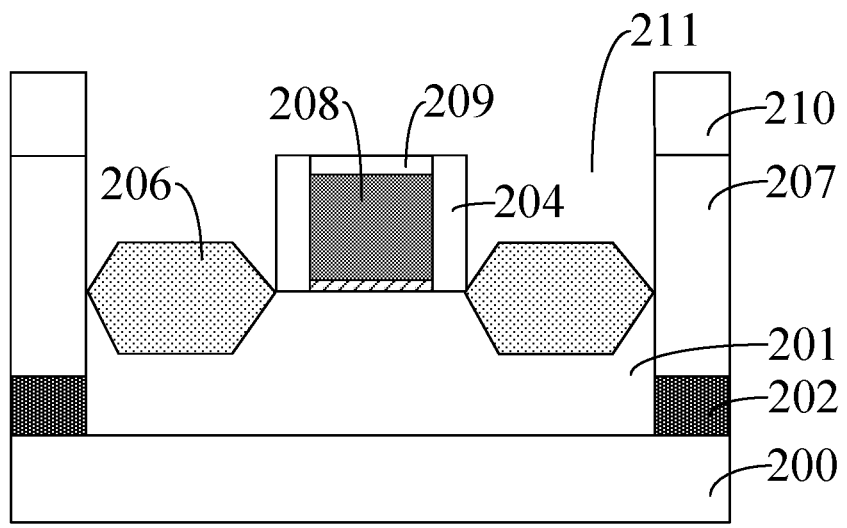

Returning to FIG. 22, after forming the second dielectric layer, a first dielectric layer opening may be formed (S108). FIGS. 11-12 illustrate a corresponding structure. FIG. 12 is a schematic C-C-sectional view of FIG. 11.

As shown in FIGS. 11-12, a first dielectric layer opening 211 may be formed in the first dielectric layer 207 and the second dielectric layer 210. The first dielectric layer opening 211 may expose the doped source/drain layers 206 and the gate structure.

In one embodiment, the process for forming the first dielectric layer opening 211 may include a wet etching process. In some embodiments, the process for forming the first dielectric layer opening may also include a dry etching process.

Figure 13:
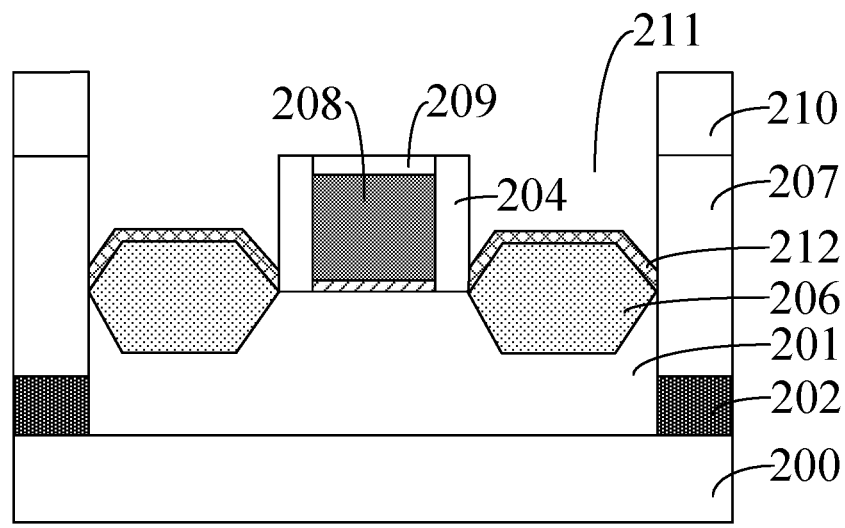

Returning to FIG. 22, after forming the first dielectric layer opening, a contact layer may be formed (S109). FIG. 13 illustrates a corresponding structure. The view direction of FIG. 13 may be same as the view direction of FIG. 12.

As shown in FIG. 13, after forming the first dielectric layer opening 211, a contact layer 212 may be formed on a doped source/drain layer 206. The function of the contact layer 212 may be to reduce the contact resistance between the doped source/drain layer 206 and the subsequently formed conductive layer.

In one embodiment, the method for forming the contact layer 212 may include forming an initial contact layer (not shown) on the doped source/drain layer 206; and performing an annealing process on the initial contact layer to form the contact layer 212.

In one embodiment, the material of the contact layer 212 is silicon titanite. In some embodiments, the material of the contact layer may also be silicon nickel, or silicon cobalt, etc.

In one embodiment, the process parameters of the annealing process may include that an annealing time may be in a range of approximately 5 s-30 s, and an annealing temperature may be in a range of approximately 600° C.-1000° C.

Figure 14:
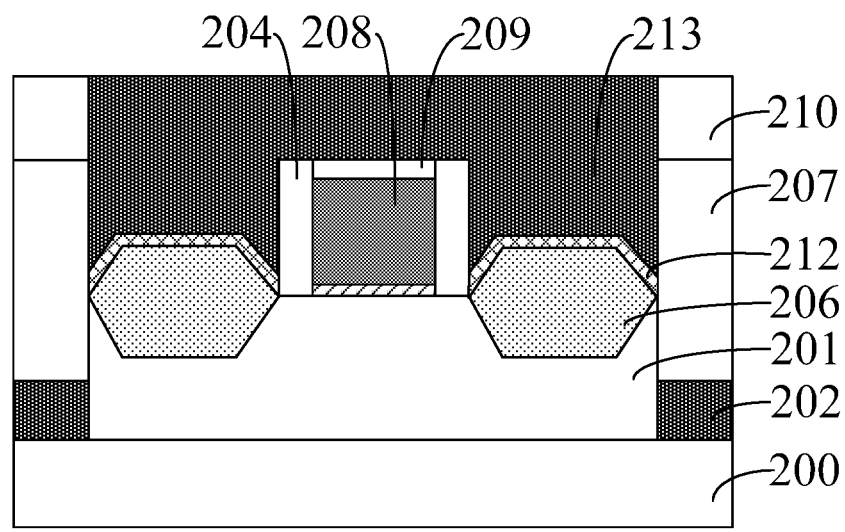

Further, as shown in FIG. 22, after forming the contact layer, an initial conductive layer may be formed (S110). FIG. 14 illustrates a corresponding structure.

As shown in FIG. 14, after forming the contact layer 212, an initial conductive layer 213 may be formed on the doped source/drain layers 206 and the gate structure. The initial conductive layer 213 may fill the first dielectric layer opening 211.

In one embodiment, the method for forming the initial conductive layer 213 may include forming an initial conductive film (not shown) in the first dielectric layer opening 211 and on the top surface of the second dielectric layer 210; and planarizing the initial conductive film until the top surface of the second dielectric layer 210 is exposed to form the initial conductive layer 213.

Figure 15:
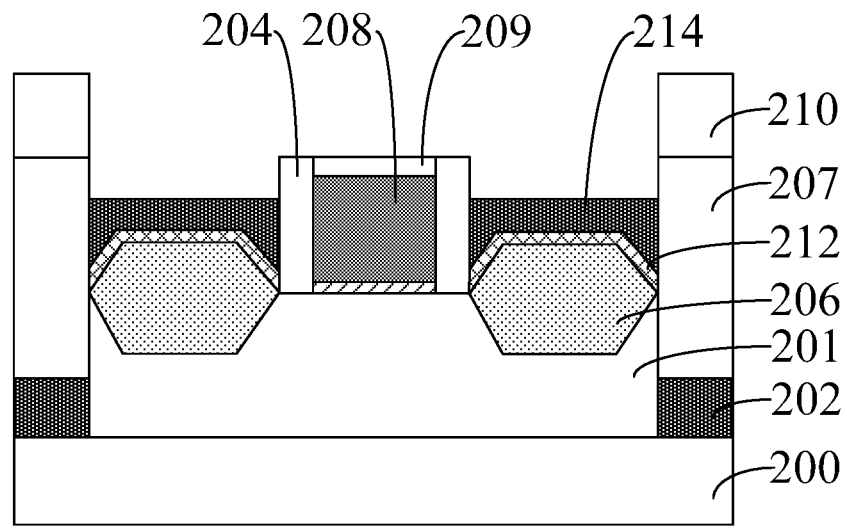

Returning to FIG. 15, after forming the initial conductive layer, a conductive layer may be formed (S111). FIG. 15 illustrates a corresponding structure.

As shown in FIG. 15, a portion of the initial conductive layer 213 may be etched away to form the conductive layer 214. The top surface of the conductive layer 214 may be lower than the top surface of the gate structure.

In one embodiment, the process for etching to remove the portion of the initial conductive layer 214 may include a wet etching process. In some embodiments, the process for etching to remove the portion of the initial conductive layer may also include a dry etching process.

In one embodiment, the distance between the top surface of the conductive layer 214 and the bottom surface of the conductive layer 214 may be in a range of approximately 20 nm to 500 nm. The height of the conductive layer 214 within such a range may not only realize that the conductive layer 214 may connect a certain number of doped source/drain layers 206, but also may effectively reduce the direct facing area between the conductive layer 214 and the gate structure. Thus, the parasitic capacitance may be reduced, and the performance of the final semiconductor structure may be improved.

The material of the conductive layer 214 may include a metal material. The metal material may include tungsten, aluminum, copper, titanium, silver, gold, lead, or nickel, etc. In one embodiment, the conductive layer 213 is made of tungsten.

After forming the conductive layer 214, the method may further include forming a conductive plug on a portion of the top surface of the conductive layer 214. The specific process for forming the conductive plug may be referred to FIG. 16 to FIG. 19.

Figure 16:
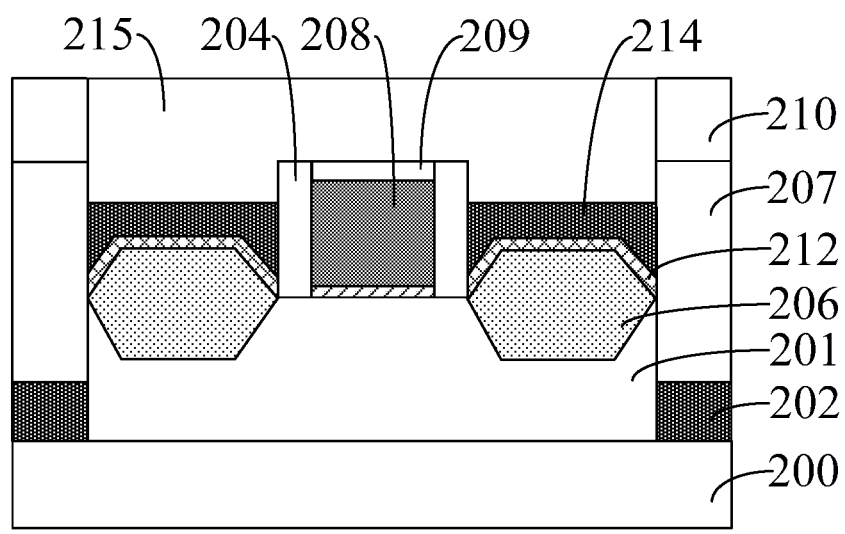

As shown in FIG. 22, after forming the conductive layer, a third dielectric layer may be formed (S112). FIG. 16 illustrates a corresponding structure.

As shown in FIG. 16, a third dielectric layer 215 may be formed on the conductive layer 214. The third dielectric layer 215 may fill the first dielectric layer opening 211.

In one embodiment, the material of the third dielectric layer 215 is silicon oxide. In some embodiments, the material of the third dielectric layer may also be a low-K dielectric material (i.e., a dielectric material with the relative dielectric constant K lower than 3.9) or an ultra-low K dielectric material (i.e., a dielectric material with a relative dielectric constant K lower than 2.5).

Figure 17:
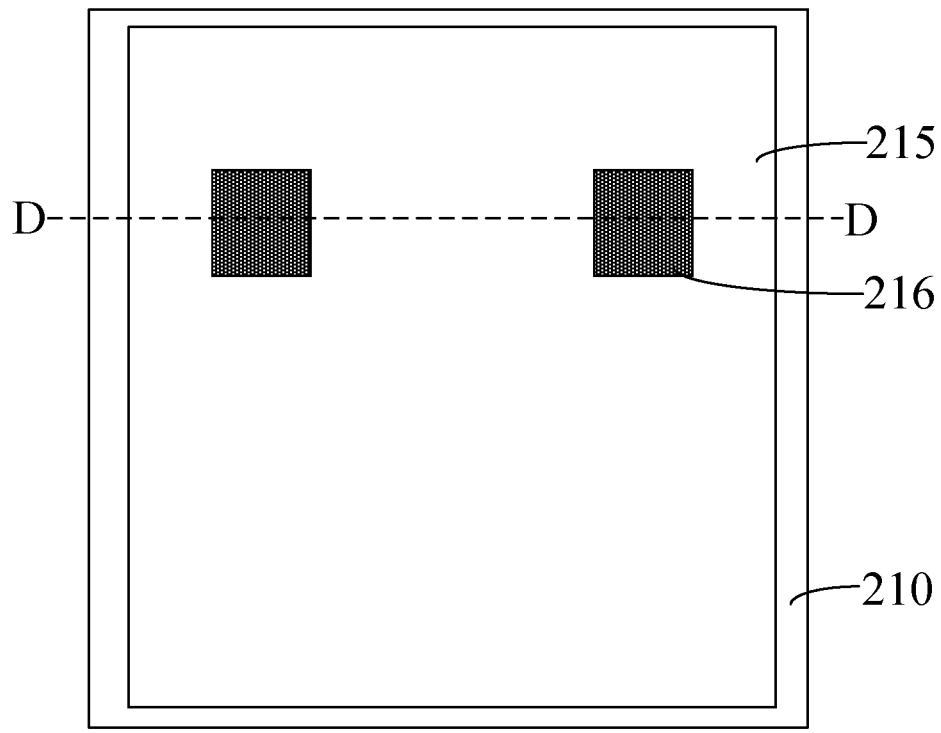
Figure 18:
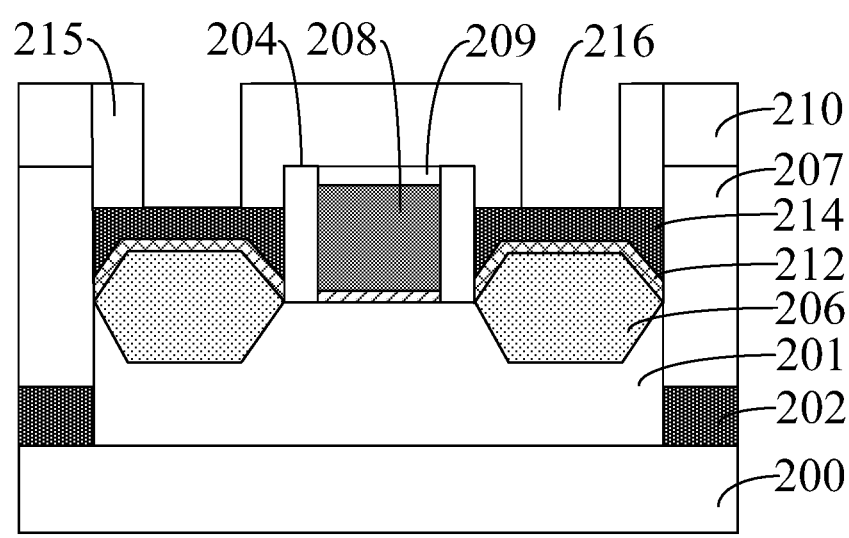

Returning to FIG. 22, after forming the third dielectric layer, a second dielectric layer opening may be formed (S113). FIGS. 17-18 illustrate a corresponding structure. FIG. 18 is a schematic D-D-sectional view of FIG. 17. As shown in FIG. 17, a second dielectric layer opening 216 may be formed in the third dielectric layer 215, and the second dielectric layer opening 216 may expose a portion of the top surface of the conductive layer 214.

In one embodiment, the process for forming the second dielectric layer opening 216 may include a wet etching process. In some embodiments, the process for forming the second dielectric layer opening may also include a dry etching process.

Figure 19:
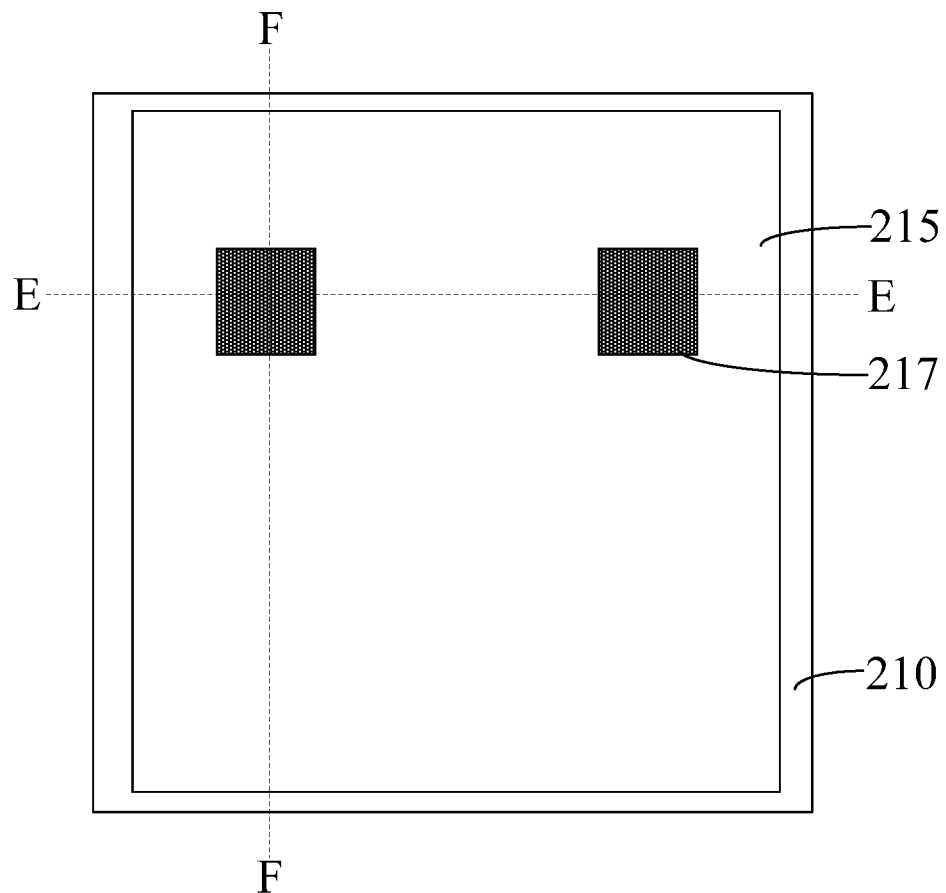
Figure 20:
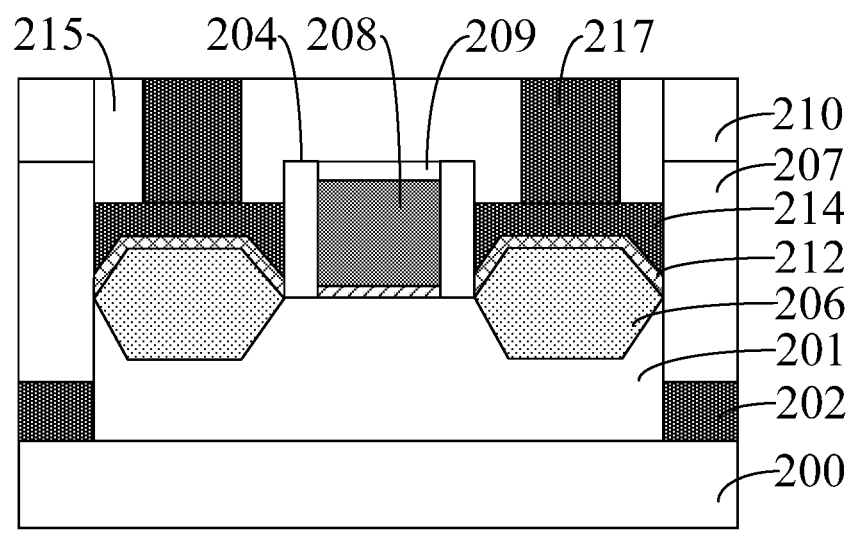

Returning to FIG. 22, after forming the second dielectric layer opening, a conductive plug may be formed in the second dielectric opening (S114). FIGS. 19-21 illustrate a corresponding structure. FIG. 20 is a schematic E-E-sectional view of FIG. 19, and FIG. 21 is a schematic FF-sectional view FIG. 19.

As shown in FIGS. 19-21, a conductive plug 217 may be formed in the second dielectric layer opening 216. The bottom surface of the conductive plug 217 may be in contact with the portion of the top surface of the conductive layer 214.

By forming the top surface of the conductive layer 214 to be lower than the top surface of the gate structure, the conductive plug 217 may be formed on the portion of the top surface of the conductive layer 214. Accordingly, the projection of the finally formed conductive layer 214 and the conductive plug 217 on the gate structure may be substantially small. Thus, the parasitic capacitance between the conductive layer 214 and the conductive plug 217 and the gate structure may be reduced, and the performance of the final semiconductor structure may be enhanced.

The material of the conductive plug 217 may include a metal material. The metal material may include tungsten, aluminum, copper, titanium, silver, gold, lead, or nickel, etc. In one embodiment, the conductive plug 217 is made of tungsten.

Correspondingly, the present disclosure also provides a semiconductor structure. A corresponding exemplary structure may be referred to FIG. 20. As shown in FIG. 20, the semiconductor structure may include a substrate 200 having a plurality of discrete fins 201, and a gate structure on the substrate 200. The gate structure may be across the fins 201 by covering portions of sidewall surfaces and top surfaces of the fins 201. Further, the semiconductor structure may include doped source/drain layers 206 in the fins 201 and at both sides of the gate structure. The doped source/drain layers 206 located in the adjacent fins 201 may be adjacent. Further, the semiconductor structure may include a conductive layer 214 located at one or both sides of the gate structure, and may be connected to multiple doped source/drain layers 206, and the top surface of the conductive layer 214 may be lower than the top surface of the gate structure. Further, the semiconductor structure may include a conductive plug 217 formed on a portion of the top surface of the conductive layer 214.

The top surface of the conductive layer 214 may be lower than the top surface of the gate structure, and the conductive plug 217 may be located on a portion of the top surface of the conductive layer 214. The projection of the finally formed conductive layer 214 and the conductive plug 217 on the gate structure may be relatively small, thus the parasitic capacitance between the conductive layer 214 and the conductive plug 217 and the gate structure may be reduced; and the performance of the final semiconductor structure may be improved.

In one embodiment, the semiconductor structure may further include an isolation structure 202 on the substrate 200. The isolation structure 202 may cover portions of the sidewall surfaces of the fins 201, and the top surface of the isolation structure 202 may be lower than the top surfaces of the fins 201.

In one embodiment, the semiconductor structure may further include a first dielectric layer 207 on the substrate 200; a second dielectric layer 210 on the first dielectric layer 207; and a third dielectric layer 215 in the first dielectric layer 207 and the second dielectric layer 210. The first dielectric layer 207 and the third dielectric layer 215 may cover the doped source/drain layers 206, the gate structure and the conductive layer 214. The third dielectric layer 215 may cover the conductive plug 217, and the third dielectric layer 215 may expose the top surface of the conductive plug 217.

In one embodiment, the semiconductor structure may further include a contact layer 212 located on the doped source/drain layer 206, and the conductive layer 214 may be located on the contact layer 212. The contact layer 212 may reduce the contact resistance between the doped source/drain layer 206 and the conductive layer 214.

In one embodiment, the material of the contact layer 212 is silicon titanite. In some embodiments, the material of the contact layer may also be silicon nickel, or cobalt silicon.

In one embodiment, the distance between the top surface of the conductive layer 214 and the bottom surface of the conductive layer 214 may be in range of approximately 20 nm to 500 nm.

In one embodiment, the material of the conductive layer 214 may include a metal material. The metal material may be is tungsten. In some embodiments, the material of the conductive layer 214 may also be aluminum, copper, titanium, silver, gold, lead, or nickel, etc.

In one embodiment, the material of the conductive plug 217 may include a metal material. In one embodiment, the metal material is tungsten. In some embodiments, the metal material of the conductive plug 217 may also be aluminum, copper, titanium, silver, gold, lead, or nickel, etc.

The technical solution of the present disclosure may have the following advantages.

In the structures of the technical solutions of the present disclosure, the top surface of the conductive layer may be lower than the top surface of the gate structure, and the conductive plug may be located on a portion of the surface of the conductive layer. As a result, the projection of the finally formed conductive layer and the conductive plug on the gate structure may be substantially small. Thus, the parasitic capacitance between the conductive layer and the conductive plug and the gate structure may be reduced, and the performance of the resulting semiconductor structure may be improved.

Further, the distance between the top surface of the conductive layer and the bottom surface of the conductive layer may be in a range of approximately 20 nm to 500 nm. The height of the conductive layer within such a range may not only realize that the conductive layer may connect a plurality of the doped source/drain layers, but also may effectively reduce the direct facing area between the conductive layer and the gate structure. Thus, the parasitic capacitance between the conductive layer and the gate structure may be reduced, and the performance of the final semiconductor structure may be improved.

In the formation method of the technical solution of the present disclosure, the top surface of the conductive layer may be formed to be lower than the top surface of the gate structure, and the conductive plug may be formed on a portion of the top surface of the conductive layer. As a result, the projection of the finally formed conductive layer and conductive plug on the gate structure may be substantially small, thus the parasitic capacitance between the conductive layer and the conductive plug and the gate structure may be reduced, and the performance of the resulting semiconductor structure may be enhanced.

Further, the distance between the top surface of the conductive layer and the bottom surface of the conductive layer may be in a range of approximately 20 nm to 500 nm. The height of the conductive layer within such a range may not only realize that the conductive layer may connect a plurality of the doped source/drain layers, but also may effectively reduce the direct facing area between the conductive layer and the gate structure. Thus, the parasitic capacitance between the conducive layer and the gate structure may be reduced, and the performance of the final semiconductor structure may be improved.

The above detailed descriptions only illustrate certain exemplary embodiments of the present disclosure, and are not intended to limit the scope of the present disclosure. Those skilled in the art can understand the specification as whole and technical features in the various embodiments can be combined into other embodiments understandable to those persons of ordinary skill in the art. Any equivalent or modification thereof, without departing from the spirit and principle of the present disclosure, falls within the true scope of the present disclosure.

What is claimed is:

1. A semiconductor structure, comprising:
a substrate;
a plurality of discrete fins on the substrate;
a gate structure, on the substrate and across the plurality of discrete fins by covering portions of sidewall surfaces and top surfaces of the plurality of discrete fins;
a plurality of doped source/drain layers, in the plurality of discrete fins and at both sides of the gate structure;
a contact layer covering entire top surfaces of the plurality of doped source/drain layers;
a conductive layer, formed at one or two sides of the gate structure, covering an entire top surface of the contact layer, and connecting multiple doped source/drain layers of the plurality of doped source/drain layers and with a top surface lower than a top surface of the gate structure, a bottom surface of the conductive layer being higher than a bottom surface of the gate structure at the top surfaces of the plurality of discrete fins, and being higher than the top surfaces of the plurality of doped source/drain layers; and
a conductive plug, on the conductive layer and in contact with a portion of the top surface of the conductive layer.

2. The semiconductor structure according to claim 1, further comprising:
an isolation structure on the substrate, covering portions of the sidewall surfaces of the plurality of fins and with a top surface lower than the top surfaces of the plurality of fins.

3. The semiconductor structure according to claim 1, further comprising:
a first dielectric layer on the substrate;
a second dielectric layer on the first dielectric layer; and
a third dielectric layer in the first dielectric layer and the second dielectric layer,
wherein:
the first dielectric layer and the third dielectric layer cover the plurality of doped source/drain layers, the gate structure and the conductive layer; and
the third dielectric layer covers the conductive plug and exposes a top surface of the conductive plug.

4. The semiconductor structure according to claim 1, wherein:
a material of the contact layer includes nickel silicide, titanium silicide, or cobalt silicide.

5. The semiconductor structure according to claim 1, wherein:
a distance between the top surface of the conductive layer and a bottom surface of the conductive layer is in a range of approximately 20 nm-500 nm.

6. A method for forming a semiconductor structure, comprising:
providing a substrate;
forming a plurality of discrete fins on the substrate;
forming a gate structure, on the substrate and across the plurality of discrete fins by covering portions of sidewall surfaces and top surfaces of the plurality of discrete fins;
forming a plurality of doped source/drain layers in the plurality of fins and at both sides of the gate structure;
forming a contact layer on the plurality of doped source/drain layers, the contact layer covering entire top surfaces of the plurality of doped source/drain layers;
forming a conductive layer at one or two sides of the gate structure, wherein the conductive layer covers an entire top surface of the contact layer, and is connected to multiple doped source/drain layers of the plurality of doped source/drain layers and a top surface of the conductive layer is lower than a top surface of the gate structure, a bottom surface of the conductive layer being higher than a bottom surface of the gate structure at the top surfaces of the plurality of discrete fins, and being higher than the top surfaces of the plurality of doped source/drain layers; and
forming a conductive plug, on the conductive layer and in contact with a portion of the top surface of the conductive layer.

7. The method according to claim 6, before forming the gate structure, further comprising:
forming an isolation structure on the substrate,
wherein the isolation structure covers portions of the sidewall surfaces of the plurality of fins and a top surface of the isolation structure is lower than the top surfaces of the plurality of fins.

8. The method according to claim 6, further comprising:
forming a first dielectric layer, on the substrate and covering sidewall surfaces of the plurality of doped source/drain layers and sidewall surfaces of the gate structure.

9. The method according to claim 8, after forming the first dielectric layer, further comprising:
forming a second dielectric layer on the first dielectric layer and the gate structure.

10. The method according to claim 9, wherein forming the conducive layer comprises:
forming a first dielectric layer opening in the first dielectric layer and the second dielectric layer to expose the plurality of doped source/drain layers and the gate structure;
forming an initial conductive layer on the plurality of doped source/drain layers and the gate structure to fill the first dielectric layer opening; and
etching the initial conductive layer to form the conductive layer with the top surface lower than the top surface of the gate structure.

11. The method according to claim 10, after forming the conductive layer, further comprising:
forming a third dielectric layer on the conductive layer to fill the first dielectric layer opening.

12. The method according to claim 11, wherein forming the conductive plug comprises:
forming a second dielectric layer opening in the third dielectric layer to expose the portion of the top surface of the conductive layer; and
forming the conductive plug in the second dielectric layer opening, wherein a bottom surface of the conductive plug is in contact with the portion of the top surface of the conductive layer.

13. The method according to claim 6, wherein:
a distance between the top surface of the conductive layer and a bottom surface of the conductive layer is in a range of approximately 20 nm-500 nm.

14. The method according to claim 6, wherein forming the contact layer comprises:
forming an initial contact layer on the plurality of doped source/drain layers; and
performing an annealing process on the initial contact layer to form the contact layer.

15. The method according to claim 14, wherein:
a material of the contact layer includes nickel silicide, titanium silicide, or cobalt silicide.

16. The method according to claim 14, wherein:
a duration of the annealing process is in a range of approximately 5 s-30 s; and
a temperature of the annealing process is in a range of approximately 600° C.-1000° C.

17. The method according to claim 6, wherein:
a material of the conductive plug includes tungsten, aluminum, copper, titanium, silver, lead, or nickel.

18. The method according to claim 6, wherein:
a material of the conductive layer includes tungsten, aluminum, copper, titanium, silver, lead, or nickel.

19. A method for forming a semiconductor structure, comprising:
providing a substrate;
forming a plurality of discrete fins on the substrate;
forming a gate structure, on the substrate and across the plurality of fins by covering portions of sidewall surfaces and top surfaces of the plurality of fins;
forming a plurality of doped source/drain layers in the plurality of fins and at both sides of the gate structure;
forming a first dielectric layer, on the substrate and covering sidewall surfaces of the plurality of doped source/drain layers and sidewall surfaces of the gate structure;
forming a second dielectric layer on the first dielectric layer and the gate structure;
forming a conductive layer at one or two sides of the gate structure, wherein the conductive layer is connected to multiple doped source/drain layers of the plurality of doped source/drain layers and a top surface of the conductive layer is lower than a top surface of the gate structure, a bottom surface of the conductive layer being higher than a bottom surface of the gate structure, and forming the conductive layer including:
forming a first dielectric layer opening in the first dielectric layer and the second dielectric layer to expose the plurality of doped source/drain layers and the gate structure;
forming an initial conductive layer on the plurality of doped source/drain layers and the gate structure to fill the first dielectric layer opening; and
etching the initial conductive layer to form the conductive layer with the top surface lower than the top surface of the gate structure; and
forming a conductive plug, on the conductive layer and in contact with a portion of the top surface of the conductive layer.

* * * * *